United States Patent
Kim et al.

[11] Patent Number: 6,049,656
[45] Date of Patent: Apr. 11, 2000

[54] METHOD OF MOUNTING AN INTEGRATED CIRCUIT ON A PRINTED CIRCUIT BOARD

[75] Inventors: Choul-Su Kim; Woo-Sik Kim; Sang-Beom Sim, all of Suwon; Masaharu Sukue; Byung-Woo Woo, both of Kyonggido, all of Rep. of Korea

[73] Assignee: SamSung Electronics Co., Ltd., Kyungki-do, Rep. of Korea

[21] Appl. No.: 08/979,311

[22] Filed: Nov. 26, 1997

[30] Foreign Application Priority Data

Nov. 26, 1996 [KR] Rep. of Korea ............... 96-57601

[51] Int. Cl.[7] .................................. B23K 31/00
[52] U.S. Cl. .............. 392/419; 219/85.12; 219/85.13; 228/33; 228/180.1; 228/223
[58] Field of Search .................. 29/840, 842, 843; 250/492.2; 228/180.1, 180.21, 180.5, 33, 223; 392/407, 411, 419, 416, 418, 421; 219/616, 85.1, 85.13, 85.12; 437/209; 174/259

[56] References Cited

U.S. PATENT DOCUMENTS

| | | | |
|---|---|---|---|
| 3,657,508 | 4/1972 | Studnick | 219/85.1 |
| 4,135,630 | 1/1979 | Snyder et al. | 214/1 BT |
| 4,151,945 | 5/1979 | Regard et al. | 228/6 |
| 4,283,847 | 8/1981 | May . | |
| 4,600,137 | 7/1986 | Comerford | 228/102 |
| 4,998,342 | 3/1991 | Bonnell et al. | 29/840 |
| 5,153,981 | 10/1992 | Soto . | |
| 5,299,279 | 3/1994 | Roberts | 392/421 |
| 5,369,879 | 12/1994 | Goeschel et al. . | |
| 5,372,972 | 12/1994 | Hayashi et al. . | |
| 5,432,303 | 7/1995 | Turek et al. | 174/259 |
| 5,479,694 | 1/1996 | Baldwin . | |
| 5,504,988 | 4/1996 | Avery et al. . | |
| 5,631,497 | 5/1997 | Miyano et al. . | |
| 5,646,444 | 7/1997 | Bartlett et al. . | |
| 5,673,479 | 10/1997 | Hawthorne . | |

*Primary Examiner*—John A. Jeffery
*Attorney, Agent, or Firm*—Robert E. Bushnell, Esq.

[57] ABSTRACT

A method of mounting an integrated circuit having a plurality of leads on a printed circuit board (PCB), by: removing foreign substances on the PCB; spreading a flux on lead patterns formed on the PCB; aligning the leads of the integrated circuit on the lead patterns on the PCB on which the flux is spread; soldering the leads and lead patterns by covering the part of a semiconductor chip of the aligned integrated circuit using a holding block and radiating an optical beam onto the whole surface thereof; and cooling the holding block and PCB which has been soldered, which prevents shorts and a poor contact generated by an earlier method. As the quality of soldering is enhanced and the lead is not pressured when soldering, the confidence of the integrated circuit after mounting is also enhanced. Moreover, by soldering all of the leads at one time, the operational time can be reduced.

20 Claims, 8 Drawing Sheets

METHOD OF MOUNTING AN INTEGRATED CIRCUIT ON A PRINTED CIRCUIT BOARD

CLAIM OF PRIORITY

This application makes reference to, incorporates the same herein, and claims all benefits accruing under 35 U.S.C. §119 from an application for A METHOD FOR MOUNTING AN INTEGRATED CIRCUIT ON A PRINTED CIRCUIT BOARD earlier filed in the Korean Industrial Property Office on the 26th of Nov. 1996 and there duly assigned Ser. No. 57601/1996.

BACKGROUND OF THE INVENTION

1. Field of the Invention

The present invention relates to a method of mounting an integrated circuit having a plurality of leads on a printed circuit board, and more particularly, to a method of mounting an integrated circuit of a tape carrier package (TCP) type on a printed circuit board (PCB).

2. Description of the Related Art

Recently, as the semiconductor technologies have developed, integrated circuits having complex functions have been introduced. As an example of such integration, the integration of a central processing unit (CPU) which performs very important functions of the microcomputer has progressed rapidly. In addition, to emit heat from the integrated circuit having complex functions, the shape of the package of the integrated circuit has been changed. For example, the CPU of a microcomputer has been developed from an 8086 8-bit processor to 80386, 80486 and 80586 thirty-two-bit processors through 80286 sixteen-bit processors. As the CPU having higher efficiencies have been developed, the number of the leads of the CPU rapidly increases. Moreover, as the density of the leads increases, new technologies for mounting the CPU on the printed circuit board have been developed.

Recent efforts in the art are exemplified by: U.S. Pat. No. 4,283,847 to May, entitled *Circuit Board Assembly*, U.S. Pat. No. 5,631,497 to Miyano et al., entitled *Film Carrier Tape And Laminated Multi-Chip Semiconductor Device Incorporating The Same*, U.S. Pat. No. 5,504,988 to Avery et al., entitled *Apparatus For Mounting Surface Mount Devices To A Circuit Board*, U.S. Pat. No. 5,479,694 to Baldwin, entitled *Method For Mounting Integrated Circuits Onto Printed Circuit Boards And Testing*, U.S. Pat. No. 5,372,972 to Hayashi et al., entitled *Method Of And An Apparatus For Processing A Lead Frame*, U.S. Pat. No. 5,369,879 to Goeschel et al., entitled *Method Of Mounting A Semiconductor Device To A Heat Sink*, U.S. Pat. No. 5,153,981 to Soto, entitled *Universal Apparatus For Forming Lead Wires*, U.S. Pat. No. 5,646,444 to Bartlett et al., entitled *Apparatus And Method For Mounting A Component To An Electrical Circuit*, and U.S. Pat. No. 5,673,479 to Hawthorne, entitled *Method For Mounting A Microelectronic Circuit Peripherally-Leaded Package Including Integral Support Member With Spacer*.

In recent days, as the high efficiency has been required even in a small computer such as a notebook computer, a Pentium (TM) processor which functions as the CPU is mounted and will continue to be mounted in compliance with the requests of users. In the case of notebook computer, however, as the miniaturization is needed, a small-sized integrated circuit is preferred. On the contrary, as the external size becomes smaller, the package form of the integrated circuit is important because of the radiation. A Pentium (TM) processor of the TCP type will be explained as an integrated circuit in an embodiment of a method for mounting the integrated circuit on the PCB of the present invention.

Conventionally, an integrated circuit of the TCP type is a very small compartment which includes 320 pins and has a spacing of 0.2 mm between the leads. Moreover, the integrated circuit of the TCP type is formed without a wire bonding which is used in the conventional semiconductor chip. As a result, as the size of the circuit is small, and the size of the printed circuit board can be smaller.

In an integrated circuit of the TCP type, at the center of a polyimide film, a semiconductor chip for performing a practical function of the integrated circuit is located. The semiconductor chip is attached to the polyimide film and it is slightly thicker than the polyimide film. Leads from the semiconductor chip are formed on the back side of the polyimide film with a pattern shape thereby maintaining the insulation between the leads and protecting them from external shock. Slots are formed at positions spaced apart from the edges of the polyimide film so as to face each edge of the semiconductor chip and a portion of the leads are exposed. An integrated circuit of the TCP type with this structure is supplied from the manufacturer with a plastic carrier for protection, and is mounted on the PCB. Once the PCB on which the operation is finished in the previous process is transported by a transporting guide rail to be provided, the PCB is fixed and a flux is evenly spread over the lead patterns on the PCB corresponding to the positions where the leads of the integrated circuit are to be soldered. By transporting the integrated circuit in which the cutting and forming are performed by a separate process to the PCB on which the flux is spread, the leads of the integrated circuit are aligned to correspond accurately to the lead patterns on the PCB. A hot bar at a high temperature presses the leads of the integrated circuit located on the lead patterns of the PCB so as to solder the leads of the integrated circuit on the lead patterns. Since solder has previously been coated on the lead patterns of the integrated circuit on the PCB during the previous process, it is possible to perform the soldering operation.

After loading the integrated circuit which is received by the plastic carrier in the tray into a cutting and forming unit for cutting and forming the leads into the integrated circuit, the integrated circuit leads are cut to a predetermined size by a cutting and forming tool suitable to lead patterns on the PCB. The cutting and forming tool is lowered on the integrated circuit and cuts the polyimide film which is located at the other side of the semiconductor chip centered around the slot. As a result, the array of the leads is properly performed after the cutting operation is finished.

According to earlier mounting method however, the leads can be misaligned when the hot bar presses the leads of the integrated circuit at a high temperature during the soldering step. As a result, shorts between adjacent leads can frequently occur and as the hot bar presses the leads directly, it is possible to damage a thin lead. Moreover, the life of the leads can be reduced though they are soldered and shorts between the leads can occur.

The PCB employing the earlier mounting method typically has a groove having a rectangular shape similar to the size of the semiconductor chip of the integrated circuit located at the position for mounting the integrated circuit. The groove is used to mount a heat sink which emits heat generated when the integrated circuit operates. Since the backside of the semiconductor chip of the integrated circuit protrudes slightly from the polyimide film, the backside of the semiconductor chip and the heat sink are connected by attaching conductive adhesive pads to the protruding part of the semiconductor chip and one end of the heat sink. The rectangular groove acts as a spacer for the connection. It takes a considerable amount of time however, to attach the heat sink and the operation is very difficult.

SUMMARY OF THE INVENTION

Therefore, it is an object of the present invention to provide a process and structure for removing short electrical currents between the adjacent leads generated when soldering the leads and not to stress the leads by not pressing the leads directly.

It is another object of the present invention to easily attach a heat sink which emits the heat generated from the integrated circuit.

According to a mounting method of the present invention, any foreign substance on a PCB is removed and a flux is spread over a lead pattern formed on the PCB. After that, the leads of the integrated circuit are positioned after being aligned on the lead patterns of the PCB on which the flux is spread. After covering the semiconductor chip of the aligned integrated circuit by a holding block and soldering the leads and the lead patterns by radiating an optical beam upon the whole surface, the soldered PCB and the holding block are cooled.

Moreover, a conductive bond can be spread over the part where the semiconductor chip of the integrated circuit is placed on the PCB, before the flux is spread. Preferably, the conductive bond is spread over an area which is 60% of the size of the semiconductor chip. The spread conductive bond is simultaneously spread over the surface of the PCB and over the back side of the PCB through a via hole which is formed to penetrate the PCB. The heat sink is attached by using the conductive bond spread on the back side of the PCB. The flux is spread using a nozzle or a stamp in which the lead pattern is carved. Before aligning the integrated circuit, the PCB can be fixed using a magnet fixing jig and the PCB is fixed by the combination of a magnetic substance attached to the holding block and the magnet fixing jig. A recognition mark formed on the PCB is used to align the integrated circuit on the PCB, and thus, the aligning operation becomes easy. Preferably, a xenon (Xe) lamp is used as a source for generating the optical beam. After adhering the integrated circuit by the holding block, the leads of the integrated circuit are aligned on the lead pattern of the PCB. As a result, when radiating the optical beam, the part of the semiconductor chip of the integrated circuit can be shielded from the optical beam.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

The objects, characteristics and advantages of the above-described invention will be more clearly understood through the preferable embodiments referring to the attached drawings.

Figure 1:
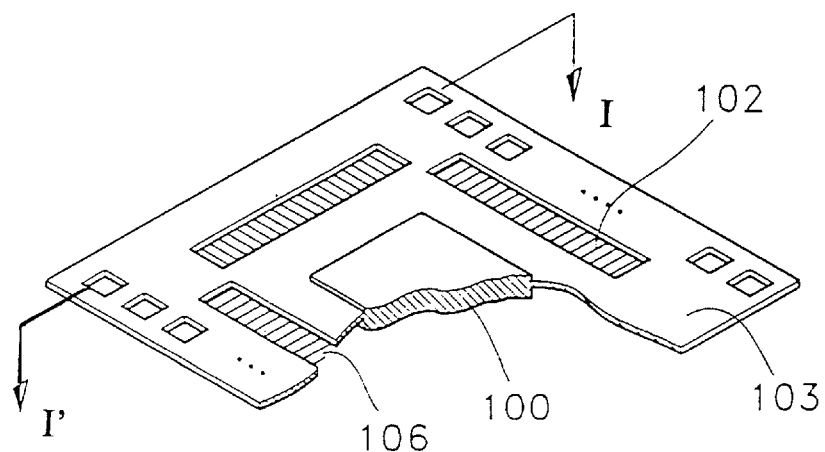
FIG. 1 is a partial cross-sectional perspective view showing an integrated circuit of the TCP type.

FIG. 1 is a perspective view which is partly cut to show an integrated circuit of the TCP type. As shown in the drawing, at the center of a polyimide film 103, a semiconductor chip 100 for performing a practical function of the integrated circuit is located. The semiconductor chip 100 is attached to the polyimide film 103 and it is slightly thicker than the polyimide film 103. Leads 102 from the semiconductor chip 100 are formed on the back side of the polyimide film 103 with a pattern shape, thereby maintaining the insulation between the leads 102 and protecting them from external shock. Moreover, slots 106 are formed at positions spaced apart from the edges on the polyimide film 103 to face each edge of the semiconductor chip 100, and some parts of the leads are exposed. The integrated circuit of the TCP type having the above-described structure, as supplied from the manufacturer, is received in a plastic carrier for protection and is mounted on the PCB.

The earlier method for mounting the integrated circuit of TCP type on the PCB is roughly illustrated.

First, when the PCB on which the operation is finished in the previous process is transported by a transporting guide rail to be provided, the PCB is fixed and a flux is evenly spread over the lead patterns on the PCB corresponding to the positions where the leads of the integrated circuit are to be soldered, using a brush. By transporting the integrated circuit in which the cutting and forming are performed by a separate process to the PCB on which the flux is spread, the leads of the integrated circuit are aligned to correspond accurately to the lead patterns on the PCB.

After that, a hot bar at a high temperature presses the leads of the integrated circuit located on the lead patterns on the PCB, and thereby the leads of the integrated circuit are soldered on the lead patterns on the PCB. At this time, as the solder has been previously coated on the lead patterns of the integrated circuit on the PCB during the previous process, it is possible to perform the soldering operation. After cooling the soldered PCB, the PCB on which the integrated circuit is mounted is unloaded onto a tray.

Next, the process for cutting and forming the leads of the integrated circuit is explained as follows. After loading the integrated circuit which is received by the plastic carrier in the tray into the cutting and forming unit, the integrated circuit leads are cut to a predetermined size by a cutting and forming tool suitable to the lead patterns on the PCB.

Figure 2:
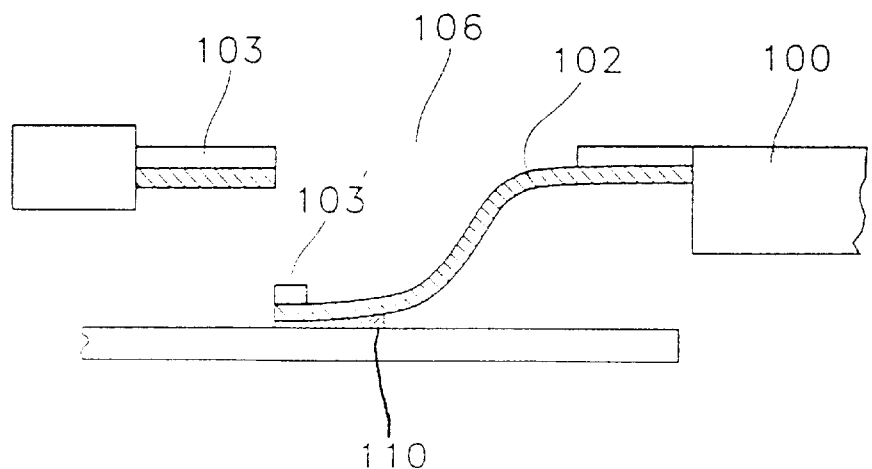
FIG. 2 is a sectional view illustrating the integrated circuit which is soldered after it is cut along the line I–I' of FIG. 1.

The cutting and forming tool is lowered on the integrated circuit which is received in the plastic carrier transported to the cutting and forming unit, and cut the integrated circuit along the line I–I' of FIG. 1. In other words, referring to FIG. 2, the cutting is performed by including a polyimide film 103, which is located at the other side of the semiconductor chip 100 centering around a slot 106. As a result, the array of the leads is properly performed after the cutting operation is finished. After that, the cut leads are formed in a predetermined shape directly by the cutting and forming tool and have a proper shape suitable to the lead pattern on the PCB.

According to the earlier mounting method however, the leads can be misaligned when the hot bar presses the leads of the integrated circuit at a high temperature during the soldering step. As a result, shorts between adjacent leads can frequently occur. As the hot bar presses the leads directly, it is possible to damage the lead having a thin thickness. Moreover, the life of the leads can be reduced though they are soldered, and shorts between the leads can occur.

Figure 3:
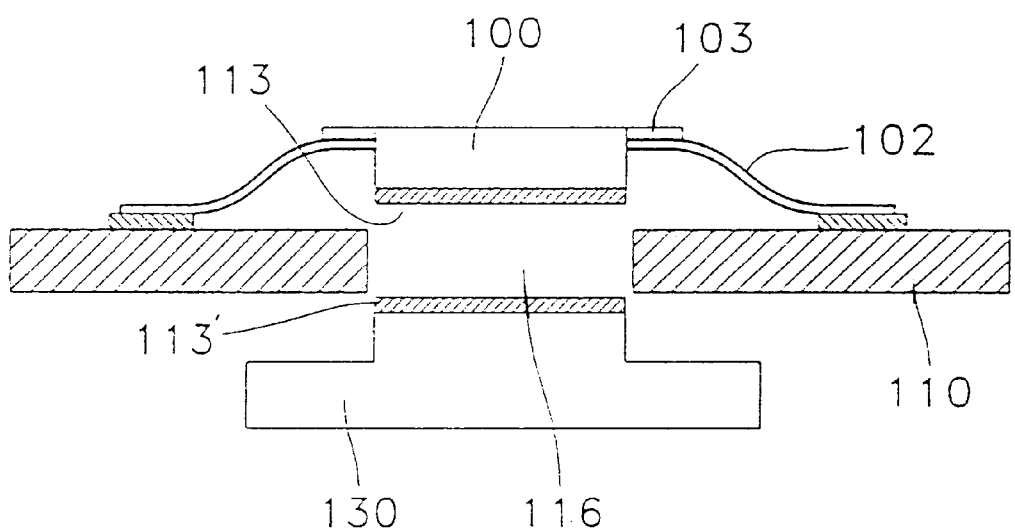
FIG. 3 is a sectional view illustrating a method for attaching a heat sink to the integrated circuit.

Referring to FIG. 3, the PCB employing the earlier mounting method has a groove 116 having a rectangular shape similar to the size of the semiconductor chip 100 of the integrated circuit at the position for mounting the integrated circuit. The groove 116 is used to mount a heat sink 130 which emits heat generated when the integrated circuit operates. In other words, as the back side of the semiconductor chip 100 of the integrated circuit protrudes slightly from the polyimide film 130, the back side of the semiconductor chip 100 and the heat sink 130 are connected by attaching conductive adhesive pads 113 and 113' to the protruding part of the semiconductor chip 100 and one end of the heat sink 130. Here, the rectangular groove 116 acts as a spacer for the connection. I have found however, it takes much time to attach the heat sink and the operation is very difficult.

Figure 4:
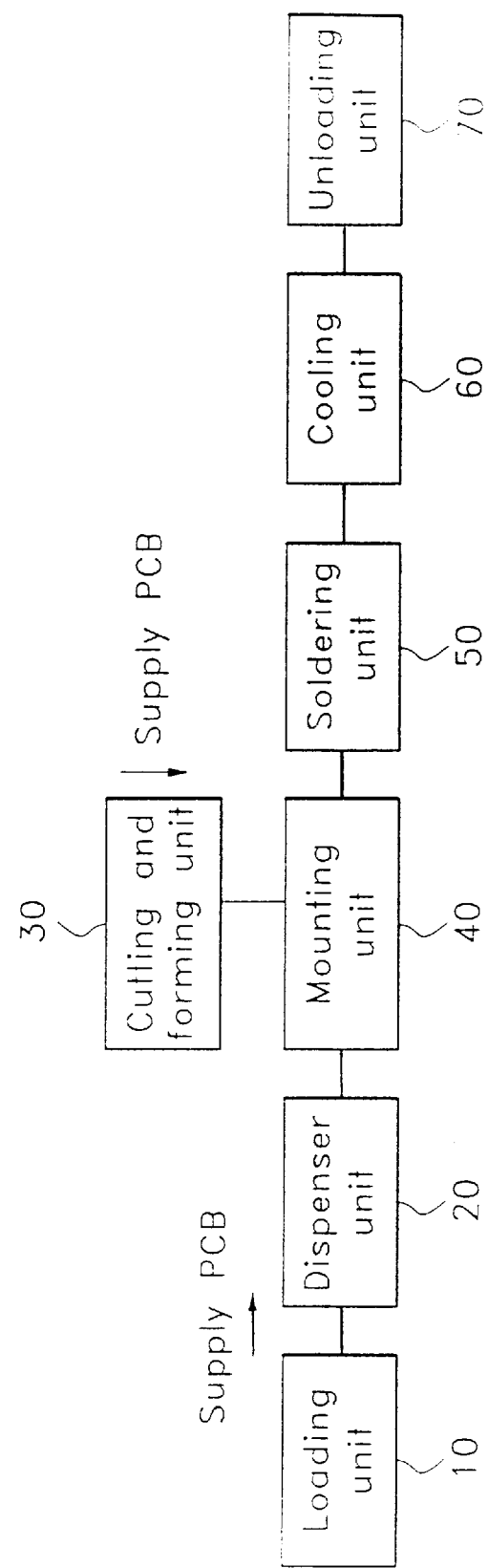
FIG. 4 is a block diagram illustrating a device for mounting the integrated circuit, according to the present invention.

Referring to FIG. 4, a device for mounting which is employed in the process of the present invention, may be constructed with: a loading unit 10 for loading an array PCB finished the operation at the previous process to the working plate; a dispenser unit 20 for spreading a conductive bond over a part corresponding to a chip of the integrated circuit on the PCB which is loaded; a cutting and forming unit 30 for cutting the integrated circuit supplied by being received in a plastic carrier into a predetermined size and forming leads; a mounting unit 40 for spreading a flux on the lead pattern of the integrated circuit on the PCB on which the conductive bond is spread and aligning the leads of the integrated circuit which are formed so as to be aligned to the pattern of the integrated circuit on the PCB; a soldering unit 50 for soldering the integrated circuit positioned on the PCB with an optical beam of a Xenon lamp; and a cooling unit for cooling the soldered PCB.

Figure 5:
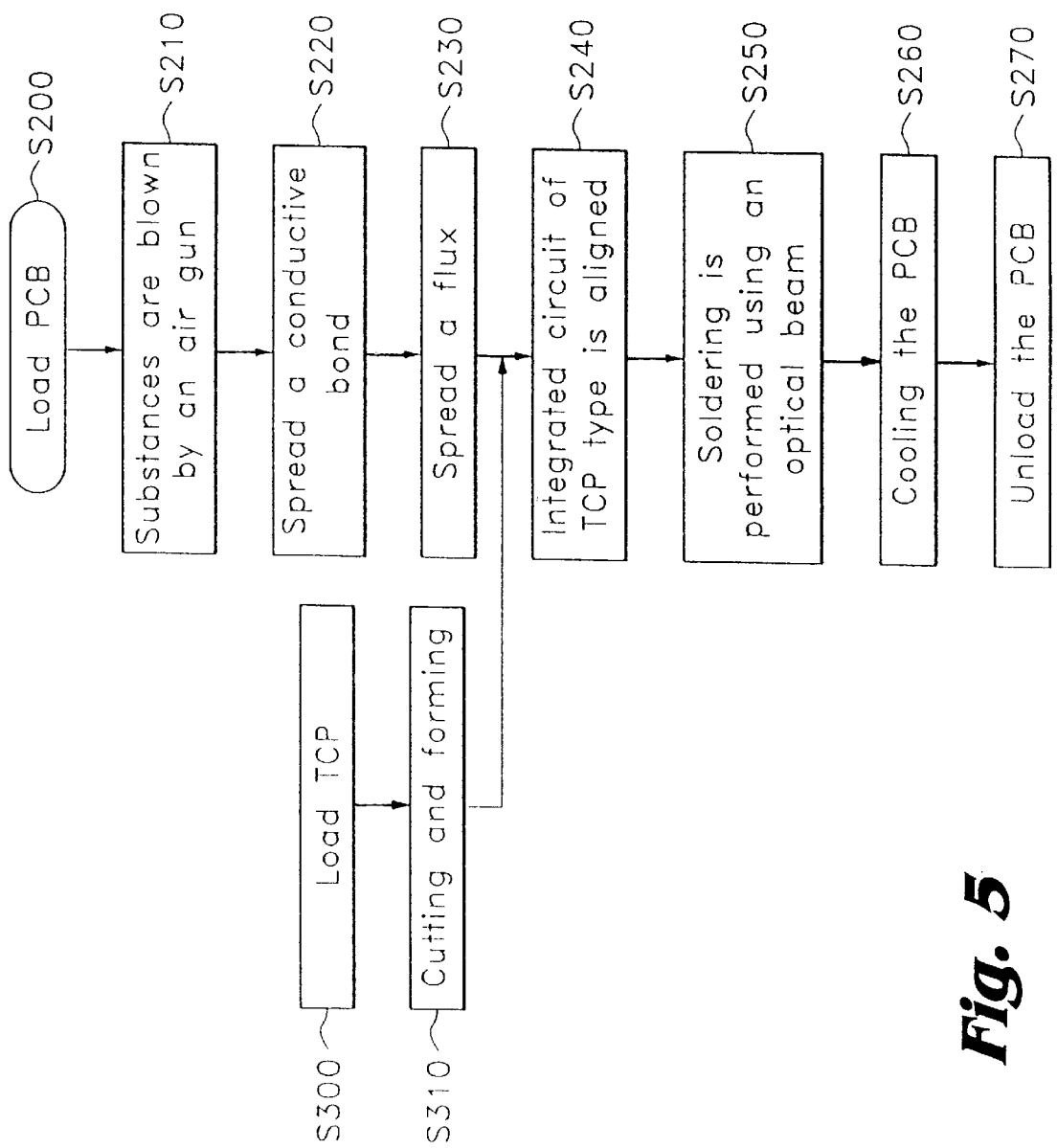
FIG. 5 is a flowchart illustrating a sequential process for mounting the integrated circuit of the present invention.
Figure 8A:
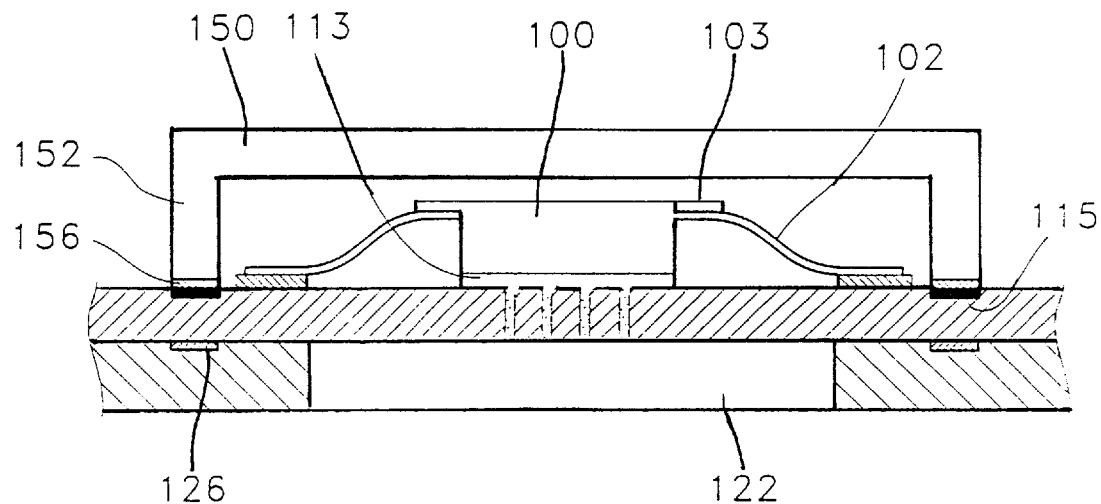
FIG. 8A is a perspective view of a magnet fixing jig.
Figure 8B:
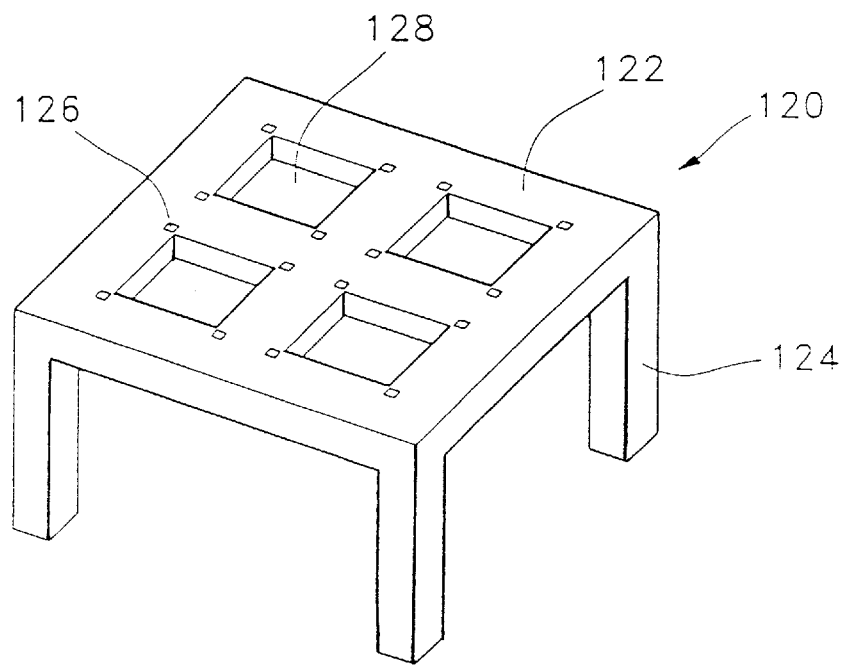
FIG. 8B is a sectional view of the magnet fixing jig on which the PCB is mounted.

The process for mounting the integrated circuit of the present invention will be explained, with reference to the drawings. Referring now to FIG. 5, contaminating substances stuck to the PCB 110 supplied to the loading unit 10 which is transported from the previous process are blown away using an air gun (Step 210). The PCB 110 supplied as a preferred embodiment of the present invention is an array PCB in which four PCBs each having a same size are combined in a one array. The array PCB 110 is transported to the next working position, and it is fixed on a magnet fixing jig 120, as shown in FIGS. 8A and 8B.

Figure 7A:
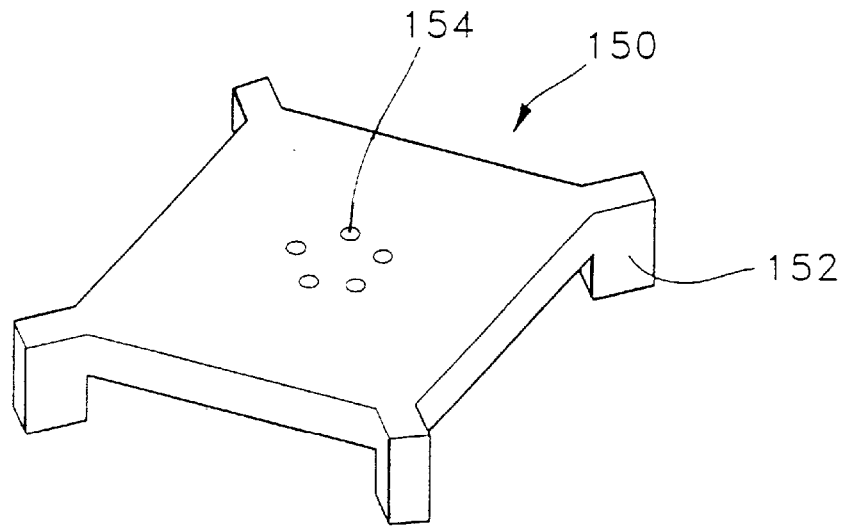
FIG. 7A is a perspective view of a holding block.
Figure 7B:
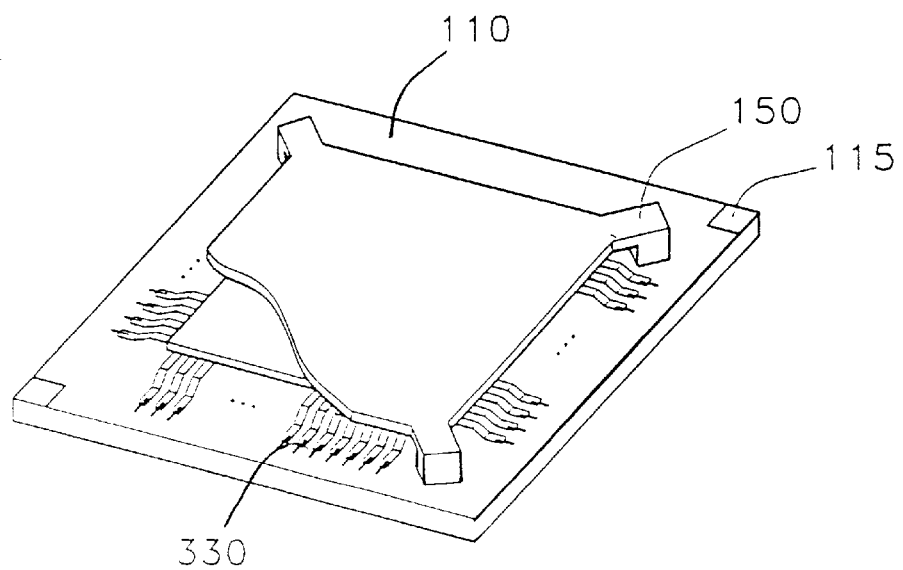
FIG. 7B is a perspective view which is partly cut illustrating the holding block being located on the integrated circuit.

The magnet fixing jig 120 includes a flat board plate 122 having a rectangular shape and supporting legs 124 formed at each edge of the flat board plate 122. On the flat board plate 122, four rectangular grooves 128 are formed corresponding to the array PCB 110. The rectangular groove 128 faces a pattern unit of the PCB 110. Moreover, magnets 126 for fixing the holding block are buried in a predetermined depth at the edges of the rectangular groove 128. For reference, as shown in FIG. 7B, a pair of recognition marks 115 are formed at the edges of the array PCB 110 in a diagonal direction. The recognition marks 115 are supposed to be reference marks when aligning the holding block 150 on the PCB 110.

After the PCB 110 is positioned on the magnet fixing jig 120, the conductive bond 114 is spread over a predetermined area from the central part of the region where the semiconductor chip 100 of the integrated circuit is disposed on the PCB 110 by a dispenser (not illustrated) located in the dispenser unit 20 (Step 220). At this time, the conductive bond 114 is preferably spread over the part corresponding to 60% of the size of the semiconductor chip 100.

Figure 9:
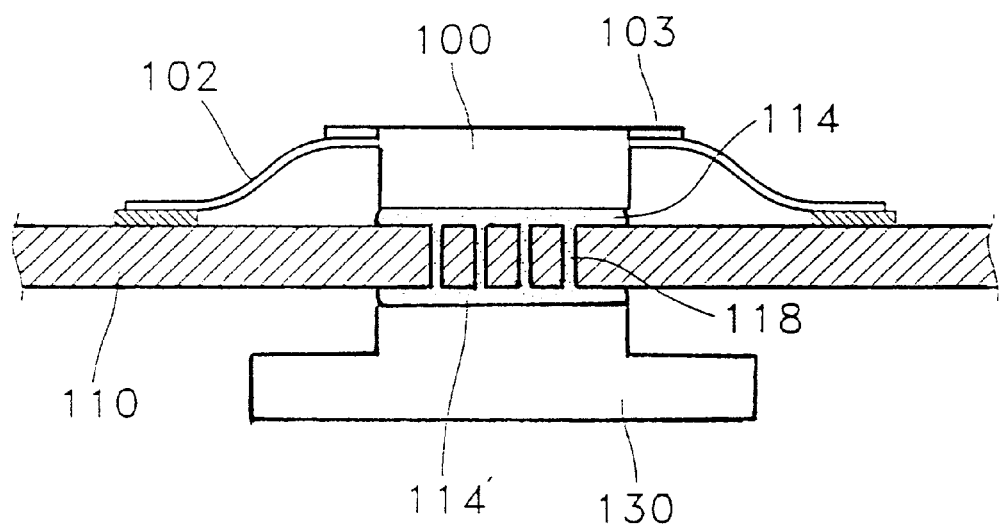
FIG. 9 is an illustrative view showing an example in which the heat sink is attached to the PCB on which the integrated circuit is mounted.

As shown in FIG. 9, a predetermined number of via holes 118 are formed at the part where the conductive bond 114 of the PCB 110 is spread. Some of the spread conductive bond 114 penetrates the via hole 118 and is spread over the back side of the PCB 110. The conductive bond 114' spread on the back side of the PCB 110 enables the heat generated when the semiconductor chip 100 of the integrated circuit operates to be emitted by attaching the heat sink 130 at the back side of the PCB 110. In other words, it is unnecessary to provide a rectangular groove in the PCB 110 to attach the heat sink 130. As the heat sink 130 can be attached to the PCB 110 only by using the spread conductive bond 114' on the back side, the operation can easily be performed. Moreover, as the spread conductive bond 114 compensates for the interval between the semiconductor chip 100 of the integrated circuit and the PCB 110 only by the leads 102 of the integrated circuit which are bent at the forming process, the stability in mounting the integrated circuit can be ensured. In the remaining three PCBs of the array PCB, the conductive bond 114 is serially spread in a similar way.

After that, the solid-powdered flux is evenly spread on the lead pattern on the PCB corresponding to the part where the leads 102 of the integrated circuit are to be soldered using a nozzle (step 230). At this time, the flux can be spread at a time by imprinting on the lead pattern of the PCB 110 after dipping a stamp in which the shape of the lead pattern of the integrated circuit is calved into the flux. The aforesaid method can spread the flux evenly and rapidly, in comparison with the conventional process using a brush. The solid powdered flux is used as a lubricant for soldering smoothly in the soldering step which will be the next step.

After that, the array PCB 110 on which the flux received on the magnet fixing jig 120 is spread is transported along the transporting guide rail and then transported to the mounting unit 40 on which a camera is mounted so as to monitor the lead pattern on the PCB 110 by magnifying the lead pattern.

Figure 6A:
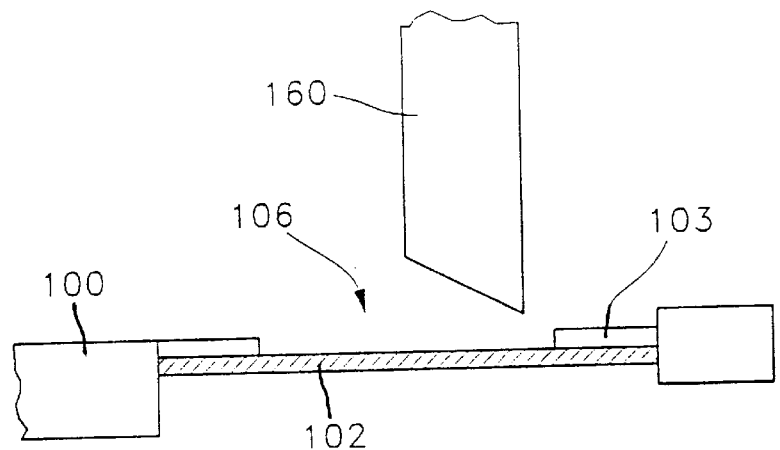
FIGS. 6A to 6C are views illustrating the process for mounting the integrated circuit, according to the present invention.
Figure 6B:
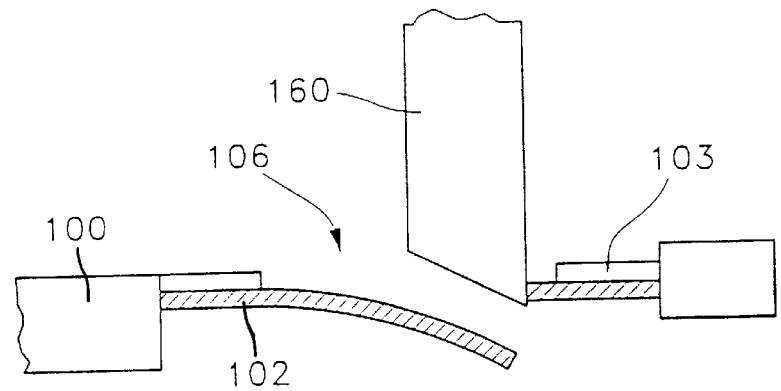
Figure 6C:
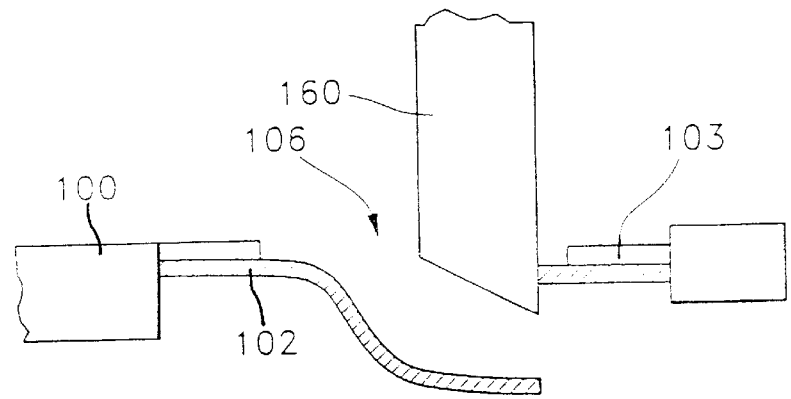

On the other hand, the integrated circuit which is received in the plastic carrier and then supplied is cut and formed in a predetermined size suitable to the lead pattern on the PCB 110 (Step 310). As shown in FIGS. 6A and 6B, the cutting and forming tool 160 lowers to around the outer end of the slot 106 and cuts a plurality of leads 102 at a time. At this time, the polyimide film 103 which is located outside of the slot 106 is removed. After that, as shown in FIG. 6C, the leads which are cut are formed as a shape each having a predetermined curvature so that they can properly be attached to the PCB 110.

After adhering the integrated circuit which finishes cutting and forming operation to the holding block 150, the integrated circuit is moved on the lead pattern of the PCB 110 so as to be aligned (Step 240). The holding block 150 is adhered by a vacuum pump and it is transported to the position where the integrated circuit which is cut and formed is located. As shown in FIG. 7A, the holding block 150 has a rectangular shape having a predetermined thickness corresponding to the shape of the semiconductor chip 100 of the integrated circuit which is cut and formed. At the central part of the rectangular shape, a predetermined number of holes 154 are included so that the integrated circuit located inside of the holding block 150 can be adhered to the holding block 150 using the vacuum pump provided inside of the mounting device. At this time, a rectangular groove (not illustrated) corresponding to the size of the semiconductor chip 100 of the integrated circuit is formed at the back side of the holding block 150 so as to adhere stably to the integrated circuit. At each edge of the holding block 150, a supporting part 152 having a predetermined length is established. As shown in FIG. 8A, magnetic substances 156 each having a predetermined thickness are attached to each lower part of the supporting parts 152. The magnetic substances are contacted to the magnets 126 located at the magnet fixing jig 120 to fix the holding block 150 in the aligning step.

The alignment can be performed automatically or manually using the image regarding the position of the PCB and the integrated circuit transmitted from the camera. In other words, the position of the PCB 110 fixed at the magnet fixing jig 120 is recognized using the recognition mark 115 of the PCB 110. The leads 102 of the integrated circuit which are formed are accurately aligned to face the upper part of the lead patterns 330 of the PCB 110. After finishing the alignment, as shown in FIG. 7B, the integrated circuit is lowered on the lead pattern 330 of the PCB 110 together with the holding block 150 by manipulating the vacuum pump. As shown in FIG. 8A, as the magnetic substances 156 attached to the lower part of the supporting parts formed at each edge of the holding block are fixed to the four magnets 126 which are reclaimed in the magnet fixing jig 120, the PCB 110 which is located in the center can be tightly fixed. As a result, the twist of the holding block 150 which can be generated when the integrated circuit is lowered on the PCB 110 can be prevented. After locating the leads 102 of the integrated circuit uniformly corresponding to the lead patterns 330 on the PCB 110, the holding block 150 and the PCB 110 on which the integrated circuit is located are transported to the soldering unit 50.

By radiating the optical beam of a xenon lamp into the integrated circuit which is fixed on the PCB 110 fixed by the magnet fixing jig 120 and the holding block 150, the soldering operation is performed at a high temperature of 300° C. (step 250). At this time, the optical beam radiates evenly into the overall lead patterns 330 on the PCB 110 which is to be soldered for an even soldering.

Differently from the conventional soldering method, as this method solders without directly pressing the lead pattern 330 on the PCB 110, the lead is hardly damaged and shorts can be prevented. The PCB 110 which finishes soldering is transported to the cooling unit 60, and the holding block 150 and the PCB 110 having a high temperature due to the soldering are cooled (step 260). After that, the holding block 150 is lifted from the PCB 110 by the vacuum pump and is unloaded (step 270), and the remaining three PCBs of the array PCB 110 repeatedly perform the above-described process.

As shown above, as the mounting method of the present invention adopt the soldering operation using the optical beam, it is possible to prevent shorts and a poor contact generated by the earlier method. As the quality of soldering is enhanced and the lead is not pressured when soldering, the reliability of the integrated circuit after mounting is also enhanced. Moreover, by soldering all the leads at one time, the operational time can be reduced.

Also, by spreading the conductive bond in advance over the part where the integrated circuit on the PCB is to be mounted, the gap between the semiconductor chip and the PCB caused by the formed lead when locating the integrated circuit on the PCB can be avoided, thereby enhancing the stability in mounting the integrated circuit. Moreover, it is unnecessary to form a rectangular groove in the PCB to attach the heat sink, and the heat sink is attached to the PCB by using the conductive bond which is spread over the back side, thereby performing the operation without difficulty.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A method of mounting an integrated circuit having a plurality of leads on a printed circuit board (PCB), comprising the steps of:

removing foreign substances on said PCB;

spreading a flux on lead patterns formed on said PCB;

spreading a conductive bond over a part of said PCB where the semiconductor chip of said integrated circuit is positioned, said conductive bond being spread over the area corresponding to 60% of the area of said semiconductor chip;

aligning the leads of said integrated circuit on the lead patterns on said PCB on which the flux is spread;

soldering said leads and lead patterns by covering the part of a semiconductor chip of said aligned integrated circuit using a holding block and radiating an optical beam onto the whole surface thereof; and cooling said holding block and said PCB which has been soldered.

2. The method of claim 1, said conductive bond being simultaneously spread over the surface of said PCB and over a back side of said PCB by a via hole formed through said PCB.

3. The method of claim 2, a heat sink being attached using said conductive bond spread over the back side of said printed circuit board.

4. The method of claim 1, said flux being spread using a nozzle.

5. The method of claim 1, said flux being spread using a stamp in which said lead patterns are carved.

6. The method of claim 5, said PCB being fixed by a magnet fixing jig, before aligning said integrated circuit thereon.

7. The method of claim 6, said PCB being fixed by a combination of a magnetic substance attached to said holding block and said magnet fixing jig.

8. The method of claim 5, a recognition mark being formed on said PCB to align said integrated circuit on said PCB.

9. The method of claim 5, a xenon Xe lamp being used as a source of said optical beam.

10. The method of claim 5, the leads of said integrated circuit being aligned on the lead patterns on said PCB after adhering said integrated circuit through said holding block.

11. The method of claim 1, said printed circuit board being fixed by a magnet fixing jig, before aligning said integrated circuit thereon.

12. The method of claim 11, said printed circuit board being fixed by a combination of a magnetic substance attached to said holding block and said magnet fixing jig.

13. The method of claim 1, a recognition mark being formed on said printed circuit board to align said integrated circuit on said printed circuit board.

14. The method of claim 1, a xenon Xe lamp being used as a source of said optical beam.

15. The method of claim 1, the leads of said integrated circuit being aligned on the lead patterns on said printed circuit board after adhering said integrated circuit through said holding block.

16. A method of mounting an integrated circuit having a plurality of leads on a printed circuit board (PCB), comprising the steps of:

removing foreign substances on said PCB;

spreading a flux on lead patterns formed on said PCB;

aligning the leads of said integrated circuit on the lead patterns on said PCB on which the flux is spread;

spreading a conductive bond over a part of said PCB where the semiconductor chip of said integrated circuit is positioned, said conductive bond being spread over the area corresponding to 60% of the area of said semiconductor chip;

simultaneously soldering said leads by covering the part of a semiconductor chip of said aligned integrated circuit using a holding block portions of which that correspond to said leads having been cut away so that only a semiconductor chip portion of said integrated circuit can be covered, and radiating an optical beam simultaneously onto the whole surface thereof excluding said semiconductor chip portions; and cooling said holding block and said PCB which has been soldered.

17. A soldering apparatus for soldering an integrated circuit having a plurality of leads on a printed circuit board (PCB), comprising:

a table for fixing a PCB having at least one aligned integrated circuit, and having a portion thereof opened correspondingly to said integrated circuit;

a spreader for spreading a conductive bond over a part of said PCB where the semiconductor chip of said integrated circuit is positioned, said conductive bond being spread over the area corresponding to 60% of the area of said semiconductor chip;

a holding block having a portion thereof that corresponds to said leads of said integrated circuit having been cut away so that only a semiconductor chip portion of said integrated circuit can be covered; and a means for radiating an optical beam onto the whole surface of said PCB when said holding block covers said semiconductor chip portion of said integrated circuit.

18. The soldering apparatus according to claim 17, said holding block having supporting portions having a selected height at the four edges thereof, magnetic substances are combined to respective ends of said supporting portions, and magnets are buried in portions of said table that correspond to said supporting portions, said magnetic substances and magnets being coupled magnetically.

19. The soldering apparatus according to claim 18, said holding block having a plurality of penetrating holes at a center thereof.

20. The soldering apparatus according to claim 19, recognition marks being formed on opposite edges of said PCB that oppose to each other.

* * * * *